United States Patent
Hirosaki

(10) Patent No.: US 7,846,351 B2
(45) Date of Patent: **\*Dec. 7, 2010**

(54) FLUORESCENT SUBSTANCE, PROCESS FOR PRODUCING THE SAME, AND LUMINESCENT DEVICE

(75) Inventor: Naoto Hirosaki, Ibaraki (JP)

(73) Assignee: National Institute for Materials Science

( * ) Notice: Subject to any disclaimer, the term of this patent is extended or adjusted under 35 U.S.C. 154(b) by 542 days.

This patent is subject to a terminal disclaimer.

(21) Appl. No.: 11/909,375

(22) PCT Filed: Mar. 20, 2006

(86) PCT No.: PCT/JP2006/305610

§ 371 (c)(1),
(2), (4) Date: Sep. 21, 2007

(87) PCT Pub. No.: WO2006/101096

PCT Pub. Date: Sep. 28, 2006

(65) Prior Publication Data

US 2009/0236969 A1    Sep. 24, 2009

(30) Foreign Application Priority Data

Mar. 22, 2005    (JP) .............................. 2005-081572

(51) Int. Cl.
*H01J 11/02* (2006.01)
*H01J 29/20* (2006.01)
*H01J 33/00* (2006.01)

(52) U.S. Cl. .................... 252/301.4 F; 252/301.4 R; 257/98; 313/503; 313/486; 313/582; 313/583; 313/467; 313/468

(58) Field of Classification Search ........... 252/301.4 F, 252/301.4 R; 313/503, 486, 582, 583, 467, 313/468; 257/98
See application file for complete search history.

(56) References Cited

U.S. PATENT DOCUMENTS 7,431,864 B2 * 10/2008 Hirosaki ................ 252/301.4 R (Continued)

FOREIGN PATENT DOCUMENTS

EP    0 155 047    9/1985

(Continued)

OTHER PUBLICATIONS

Chong-Min Wang et al, "Silicon nitride crystal structure and observations of lattice defects", Journal of Materials Science, 1996, vol. 31, pp. 5281-5298.

(Continued)

*Primary Examiner*—C. Melissa Koslow
(74) *Attorney, Agent, or Firm*—Antonelli, Terry, Stout & Kraus, LLP.

(57) ABSTRACT

This invention provides a blue phosphor, which has higher blue brightness and larger half-value width in an emission spectrum as compared with the conventional rare earth-activated sialon phosphor and has better durability as compared with the conventional oxide phosphor. The phosphor comprises a metal element M, wherein M represents Ce, dissolved as a solid solute in a nitride or oxynitride crystal having a β-type $Si_3N_4$ crystal structure, an AlN crystal structure, or an AlN polytype structure, and emits fluorescence having a peak in a wavelength region of 450 nm to 500 nm upon exposure to light from an excitation source.

20 Claims, 2 Drawing Sheets

U.S. PATENT DOCUMENTS

| | | |
|---|---|---|
| 2003/0168643 A1 | 9/2003 | Mitomo et al. |
| 2005/0001225 A1 | 1/2005 | Yoshimura et al. |

FOREIGN PATENT DOCUMENTS

| | | |
|---|---|---|
| EP | 1 445 295 | 8/2004 |
| EP | 1 884 552 | 2/2008 |
| JP | S60-206889 A | 10/1985 |
| JP | 2002-363554 A | 12/2002 |
| JP | 2003-096446 | 4/2003 |
| JP | 2003-203504 A | 7/2003 |
| JP | 2003-336059 A | 11/2003 |
| JP | 2004-186278 | 7/2004 |
| JP | 2004-238505 A | 8/2004 |
| JP | 2004-277663 | 10/2004 |
| JP | 2005-008793 A | 1/2005 |
| JP | 2005-255895 A | 9/2005 |
| JP | 2006-008721 A | 1/2006 |
| WO | WO 2005/019376 A1 | 3/2005 |
| WO | WO 2005/033247 A1 | 4/2005 |
| WO | WO 2005/087896 A1 | 9/2005 |

OTHER PUBLICATIONS

Supplementary European Search Report issued in European Patent Application No. 06729577.4 on Jul. 31, 2009.

Naoto Hirosaki, et al. "Characterization and properties of green-emitting β-SiAlON:$Eu^{2+}$ powder phosphors for white light-emitting diodes", Applied Physics Letters, vol. 86, May 17, 2005, pp. 211905-1-211905-3, XP002536727.

European Search Report issued in European Patent Application No. 06729578.2 on Dec. 23, 2009.

S.B. Aldabergenova et al., "Blue, green and red emission from $Ce^{3+}$, $Tb^{3+}$ and $Eu^{3+}$ ions in amorphous GaN and AlN thin films", Journal of Non-Crystalline Solids 299-302 (2002), pp. 709-713.

* cited by examiner

US 7,846,351 B2

FLUORESCENT SUBSTANCE, PROCESS FOR PRODUCING THE SAME, AND LUMINESCENT DEVICE

FIELD OF THE INVENTION

The present invention relates to fluorescent substance (or phosphor) having $\beta$-$Si_3N_4$ crystal structure, AlN crystal structure, and/or AlN polytype structure; a manufacture method thereof; and an application thereof. More specifically, the application of the phosphor relates to a luminescent device and an image display device which utilize properties of the phosphor, that is, specific features of emitting a blue fluorescent spectrum having an emission peak in a wavelength region that is at least 450 nm and does not exceed 500 nm.

BACKGROUND OF THE INVENTION

The phosphor is utilized in a fluorescent display tube (VFD: vacuum fluorescent display), a field emission display (FED), a plasma display panel (PDP), a cathode-ray tube (CRT), a white light-emitting diode (LED), and so on. In any of these applications, it is necessary to provide a phosphor with energy to excite the phosphor in order to have the phosphor emit a fluorescence and the phosphor is excited by an excitation source with high energy such as a vacuum ultraviolet ray, an ultraviolet ray, an electron beam, and blue light so as to emit a visible light ray. However, as a result that the phosphor is exposed to such excitation source, the brightness of the phosphor is lowered so that the phosphor itself tends to be degraded. Therefore, the phosphor having the brightness little degraded is desired. Therefore, a sialon phosphor has been proposed as a phosphor having the brightness little degraded instead for the conventional phosphor such as silicate phosphor, phosphate phosphor, aluminate phosphor, sulfide phosphor.

As an example of these sialon phosphors is manufactured in the following manufacturing process as generally described below. First, silicon nitride ($Si_3N_4$) aluminum nitride (AlN), Europium oxide ($Eu_2O_3$) are mixed at predetermined molar ratios thereof and the resultant mixture is fired by a hot press method in one atmosphere (0.1 MPa) of nitrogen atmosphere at 1700 degree Celsius for one hour (for example, refer to Patent reference 1). It was reported that $\alpha$-sialon activated by Eu ion manufactured in the above process became a phosphor to emit a yellow light of wavelength region of 550 nm to 600 nm if it is excited by the blue light having a wavelength region of 450 to 500 nm.

Further, a blue phosphor activated by Ce having a host crystal of JEM phase ($LaAl(Si_{6-z}Al_z)N_{10-z}O_z$) (refer to Patent reference 2), a blue phosphor activated by Ce having a host crystal of $La_3Si_8N_{11}O_4$ (refer to Patent reference 3), and a red phosphor activated by Eu having a host crystal of $CaAlSiN_3$ (refer to Patent reference 4) are known.

As another sialon phosphor, a phosphor of $\beta$-sialon doped with rare earth element having z=3 is also known (refer to Patent reference 5) and it is shown that phosphors activated by Tb, Yb, and Ag are those which emit a green light of 525 nm to 545 nm. It is also known that a phosphor activated by Ce becomes a phosphor that emits a blue light of 440 to 460 nm as it is excited by an ultraviolet light of 300 to 315 nm. However, a phosphor having high brightness has not been obtained since the activation elements do not solid solve adequately in the host crystal, but reside in the boundary phase because the synthesis temperature is so low as 1500 degree Celsius. Further, as another sialon phosphor, $\beta$-sialon phosphor activated by Eu is known (refer to Patent reference 6) and it emits a green fluorescent light.

Further, since the conventional phosphors emit particular color spectra, each of which has a small wavelength width that is evaluated by the half-value width, it is necessary to combine many phosphors to emit a white color as LED such that there was a problem that the emission intensity of the white light might be lowered because of the mutual interaction among the phosphors.

[Patent reference 1] Japanese patent application publication No. 2002-363554.

[Patent reference 2] Japanese patent application No. 2003-208409.

[Patent reference 3] Japanese patent application No. 2003-346013.

[Patent reference 4] Japanese patent application No. 2003-394855.

[Patent reference 5] Japanese patent application publication No. S60-206889.

[Patent reference 6] Japanese patent application No. 2004-070894.

DESCRIPTION OF THE INVENTION

Problems to be Solved by the Invention

An object of the present invention is to provide what satisfies such desires so as to provide a blue phosphor that has higher durability than the conventional oxide phosphor and emits a blue light with a rather broad half-value width having higher brightness than the conventional rare earth activated sialon phosphor.

Means for Solving Problems

The present inventor has found that some nitride including M (here, M is Ce), Si, Al, O, and N which has a specific composition range, a specific solid solution state, and a specific crystal phase becomes a phosphor that emits a fluorescent light having a fluorescent peak in a wavelength region between 450 nm and 500 nm after he devoted himself to the investigation. That is, it has been found that a solid solution crystal doped with Ce as a luminescence center and having a nitride or oxynitride of a $\beta$-$Si_3N_4$ crystal structure or an AlN crystal structure as the host crystal becomes a phosphor that emits a fluorescent light having a peak in the wavelength region of 450 nm to 500 nm. In particular, it has been found that a $\beta$-sialon synthesized at a temperature higher than 1820 degree Celsius emits a blue fluorescent light having a good color purity and a peak in a wavelength of 450 nm to 500 nm as Ce solid solves in the $\beta$-sialon crystal.

The $\beta$-$Si_3N_4$ crystal structure has symmetry of $P6_3$ or $P6_3/m$ and is defined as a structure which has ideal atomic positions as shown in Table 1 (refer to Non-Patent reference 1). As nitride or oxynitride having this type of crystal structure, $\beta$-$Si_3N_4$, $\beta$-$Ge_3N_4$, and $\beta$-sialon ($Si_{6-z}Al_zO_zN_{8-z}$, Here, $0<z<4.2$) and so on are known. Further, it is generally supposed that $\beta$-sialon does not solid-solve a metal element as a solute if the $\beta$-sialon is synthesized at a temperature lower than 1700 degree Celsius and it is known that a metal oxide added as a sintering agent forms a glass phase in a grain boundary in which the metal oxide resides. When a metal element is incorporated into the sialon crystal, $\alpha$-sialon as described in Patent reference 1 is used. In Table 1, the crystallographic structural data is shown based on the atomic coordinate of β-silicon nitride.

[Non-Patent reference 1] Chong-Min Wang, et. al.; "Journal of Materials Science" pp. 5281-5298, vol. 31 in 1996.

TABLE 1

| Atomic coordinate of β-Si₃N₄ crystal | | | |
|---|---|---|---|
| | x/a | y/a | z/c |
| Si: 6(h) | 0.7686 | 0.1744 | 0.2500 |
| N1: 6(h) | 0.0298 | 0.3294 | 0.2628 |
| N2: 2(c) | 0.6667 | 0.3333 | 0.2392 |

Space group: $P6_3$

Lattice constant a=0.7595 nm, c=0.29023 nm

R. Grun, Acta Crystallogr. B35 (1979) 800

The $\beta$-$Si_3N_4$ and the β-sialon have been investigated as heat resistant material, but the description that optically activating elements are solid-solved in the host crystal and that the crystal with solid solution is utilized as a phosphor is made only in Patent reference 5 with respect to the specific elements.

According to Patent reference 5, as a phosphor having a fluorescent peak in a wavelength region of 390 nm to 600 nm, the phosphors with the addition of Tb, Yb, Ag, Ce, Bi, and Eu are reported. However, in such phosphors, as described above, it is plausible that activating elements were not sufficiently solid solved in the crystal, but they remained in grain boundaries such that the obtained phosphors did not have high brightness since the synthesizing temperature was so low as 1500 degree Celsius. Then, in the present invention, phosphors indicating fluorescent phenomena with high brightness in a specific wavelength region and a method of making the phosphors; and a light and an image display device utilizing these phosphors are provided. More specifically, the following is provided.

(1) A phosphor comprising: a nitride or oxynitride crystal solid solving Ce and having $\beta$-$Si_3N_4$ crystal structure, AlN crystal structure, or AlN polytype structure, wherein the phosphor emits a fluorescent light having a peak in a wavelength region of 450 nm to 500 nm upon irradiation of an excitation source.

(2) The phosphor according to the above (1) wherein the phosphor emits the fluorescent light having the peak in a wavelength region of 470 nm to 490 nm upon irradiation of the excitation source.

(3) The phosphor according to the above (1) or (2) wherein the excitation source is an ultraviolet light or a visible light having a wavelength in a region that is at least 100 nm and does not exceed 470 nm.

(4) The phosphor according to any one from above (1) to (3) wherein the excitation source is an violet light having a wavelength in a region from 380 nm to 430 nm.

(5) The phosphor according to any one from above (1) to (4) wherein the nitride or oxynitride crystal having the $\beta$-$Si_3N_4$ crystal structure comprises β-sialon ($Si_{6-z}Al_zO_zN_{8-z}$, Here, 0<z<4.2).

(6) The phosphor according to any one from above (1) to (5) wherein the fluorescent light emitted by means of the excitation source has a half-value width of the peak equal to or more than 80 nm.

Here, the half-value width may generally mean a peak width at a half height position of the peak height. With respect to the emission spectrum of the phosphor of the present invention, it is plausible that the peak width of the emission spectrum caused by the solid solved Ce as the emission center becomes wider than that of the emission spectrum caused by the Ce that is not solid solved.

(7) The phosphor according to any one from above (1) to (6) wherein the nitride or the oxynitride crystal has a composition expressed by a formula of $M_aA_bX_c$ (in the formula, a+b+c=1) wherein M (Here, M is Ce), A (Here, A is one or two elements selected from Si and Al), and X (Here, X is one or two elements selected from O and N); and wherein the following conditions are satisfied:

$$0.00001 \leq a \leq 0.01 \quad (1),$$

$$0.38 \leq b \leq 0.52 \quad (2),$$

and $$0.45 \leq c \leq 0.61 \quad (3).$$

In this composition range, it is plausible that each crystal in $\beta$-$Si_3N_4$ crystal structure, AlN crystal structure, or AlN polytype structure exists in a scattered manner.

(8) The phosphor according to any one from above (1) to (7) wherein the nitride or the oxynitride crystal has a composition expressed by a formula of $Ce_dSi_eAl_fO_gN_h$ (in the formula, d+e+f+g+h=1); and wherein the following conditions are satisfied:

$$0.00001 \leq d \leq 0.01 \quad (4),$$

$$0.07 \leq e \leq 0.42 \quad (5),$$

$$0.005 \leq f \leq 0.41 \quad (6),$$

$$0.0005 \leq g \leq 0.1 \quad (7),$$

and $$0 \leq h \leq 1 \quad (8).$$

Here, in this composition range, it is possible to obtain a phosphor that emits the fluorescent light having an emission peak with a wide half-value width, which has a particularly high blue color emission intensity.

(9) The phosphor according to any one from above (1) to (8) wherein color of the fluorescent light emitted upon irradiation of the excitation source has (x, y) chromaticity coordinates in the CIE chromaticity coordinates satisfying conditions:

$$0 \leq x \leq 0.3 \text{ and } 0 \leq y \leq 0.4.$$

(10) The phosphor according to any one from the above (1) to (9) wherein the nitride or oxynitride crystal comprises: single crystals having an average particle diameter that is at least 50 nm and does not exceed 20 µm.

(11) The phosphor according to any one from the above (1) to (10) wherein a sum of Fe, Co, and Ni impurity elements does not exceed 500 ppm.

(12) The phosphor according to any one from the above (1) to (11) wherein the nitride or oxynitride crystal is produced as a mixture including another crystal or amorphous compound and wherein an amount of the nitride or oxynitride crystal is at least 50 mass % in the mixture.

(13) The phosphor according to the above (12) wherein the other crystal or amorphous compound is conductive inorganic compound.

(14) The phosphor according to the above (13) wherein the conductive inorganic compound comprises: oxide, oxynitride, nitride, or mixture thereof including one or more kinds of elements selected from Zn, Ga, In, and Sn.

(15) A method of manufacturing the phosphor recited in any one from the above (1) to (14) comprising the step of: firing a raw mixture in a nitrogen atmosphere at a temperature that is at least 1820 degree Celsius and does not exceed 2200 degree Celsius.

(16) The method of manufacturing the phosphor according to the above (15) wherein the raw mixture comprises: metal, oxide, carbonate, nitride, fluoride, chloride, or oxynitride of Ce; and silicon nitride or aluminum nitride.

(17) The method of manufacturing the phosphor according to the above (15) or (16) wherein the nitrogen atmosphere is an atmosphere of nitrogen of a pressure range that is at least 0.1 MPa and does not exceed 100 MPa in the firing step.

(18) The method of manufacturing the phosphor according to any one from the above (15) to (17) further comprising the step of: preparing the raw mixture by filling a metal compound in a powder state or an aggregate state in a container with a filling rate that does not exceed 40% of bulk density before the firing step.

(19) The method of manufacturing the phosphor according to the above (18) wherein the container is made of boron nitride.

(20) The method of manufacturing the phosphor according to the above (18) or (19) wherein an average particle diameter of aggregates of the metal compound does not exceed 500 μm.

(21) The method of manufacturing the phosphor according to the above (20) further comprising the step of: making the average particle diameter of the aggregates of the metal compound not exceeding 500 μm by a spray dryer, a sieving, or an air classifier.

(22) The method of manufacturing the phosphor according to any one from the above (15) to (21) further comprising the step of: controlling particle sizes by making the average particle diameter of the fired phosphor at least 50 nm and not exceeding 20 μm by one or more measures selected from a pulverization, a classification, and acid processing.

(23) The method of manufacturing the phosphor according to any one from the above (15) to (22) further comprising the step of: heat treating a phosphor, after the firing step or after the step of controlling the particle sizes, at a temperature that is at least 1000 degree Celsius and is less than the firing temperature of the firing step.

(24) The method of manufacturing the phosphor according to any one from the above (15) to (23) wherein the raw mixture comprises: an inorganic compound yielding a liquid phase at a temperature not exceeding the firing temperature in the firing step.

(25) The method of manufacturing the phosphor according to the above (24) wherein the inorganic compound yielding the liquid phase at the temperature not exceeding the firing temperature comprises: one or more kinds of mixtures selected from fluoride, chloride, iodide, bromide, and phosphate of one or more elements selected from Li, Na, K, Mg, Ca, Sr, and Ba.

(26) The method of manufacturing the phosphor according to the above (25) wherein the inorganic compound yielding the liquid phase at the temperature not exceeding the firing temperature is calcium fluoride.

(27) The method of manufacturing the phosphor according to any one from the above (24) to (26) wherein the raw mixture comprises: an amount of the inorganic compound yielding the liquid phase at the temperature not exceeding the firing temperature, the amount being at least 0.1 pts. wt and not exceeding 10 pts. wt based on 100 pts. wt of the raw mixture.

(28) The method of manufacturing the phosphor according to any one from the above (24) to (27) further comprising the step of: washing the phosphor after the firing step with solvent so as to reduce a content of the inorganic compound yielding the liquid phase at the temperature not exceeding the firing temperature.

(29) A luminescent device comprising: a light-emitting source and a phosphor, wherein the phosphor comprises: the phosphor recited in any one from the above (1) to (14).

(30) The luminescent device according to the above (29) wherein the light-emitting source comprises: a light-emitting diode (LED) and/or a laser diode (LD) which emits light of a wavelength from 380 nm to 430 nm.

(31) The luminescent device according to the above (29) or (30), wherein the light-emitting source is a light-emitting diode (LED) and/or a laser diode (LD) which emits light of a wavelength from 380 nm to 430 nm; wherein the phosphor comprises: a blue phosphor having an emission peak in a wavelength region that is at least 450 nm and does not exceed 500 nm upon irradiation of an excitation light in a wavelength region of 380 to 430 nm, and a green phosphor having an emission peak in a wavelength region that is at least 500 nm and does not exceed 600 nm upon irradiation of an excitation light in a wavelength region of 380 to 430 nm, and a red phosphor having an emission peak in a wavelength region that is at least 600 nm and does not exceed 700 nm upon irradiation of an excitation light in a wavelength region of 380 to 430 nm; and wherein the luminescent device emits a white light by mixing a blue light, a green light, and a red light.

(32) An image display device comprising: an excitation source and a phosphor, wherein the phosphor comprises: the phosphor recited in any one from the above (1) to (14).

(33) The image display device according to the above (32) further comprising: any one of a fluorescent display tube (VFD), a field emission display (FED), a plasma display panel (PDP), and a cathode-ray tube (CRT).

A phosphor according to the present invention is excellent as a blue phosphor as compared to the conventional sialon or oxynitride phosphor because the emission intensity in the wavelength region from 450 nm to 500 nm is high since the phosphor includes mainly a solid solution body of a crystal phase of nitride or oxynitride having $\beta$-$Si_3N_4$ crystal structure, AlN crystal structure, or AlN polytype structure. Further, the width of the emission spectrum (for example, half-value width) is large enough to be excellent as a phosphor for the white LED use. For example, it is preferable that the half-value width is at least 30 nm, more preferably it is at least 50 nm, and further preferably it is at least 80 nm. The half-value width may not be limited by the upper limit such that it is more preferably to be wider. However, the upper limit may be determined by itself due to the properties of the emission spectrum. Even though the phosphor is exposed to the excitation source, the brightness of this phosphor is not lowered and a nitride compound thereof which leads to a useful phosphor to be utilized in VFD, FED, PDP, LED, white CRT, and the like is provided.

Figure 1:
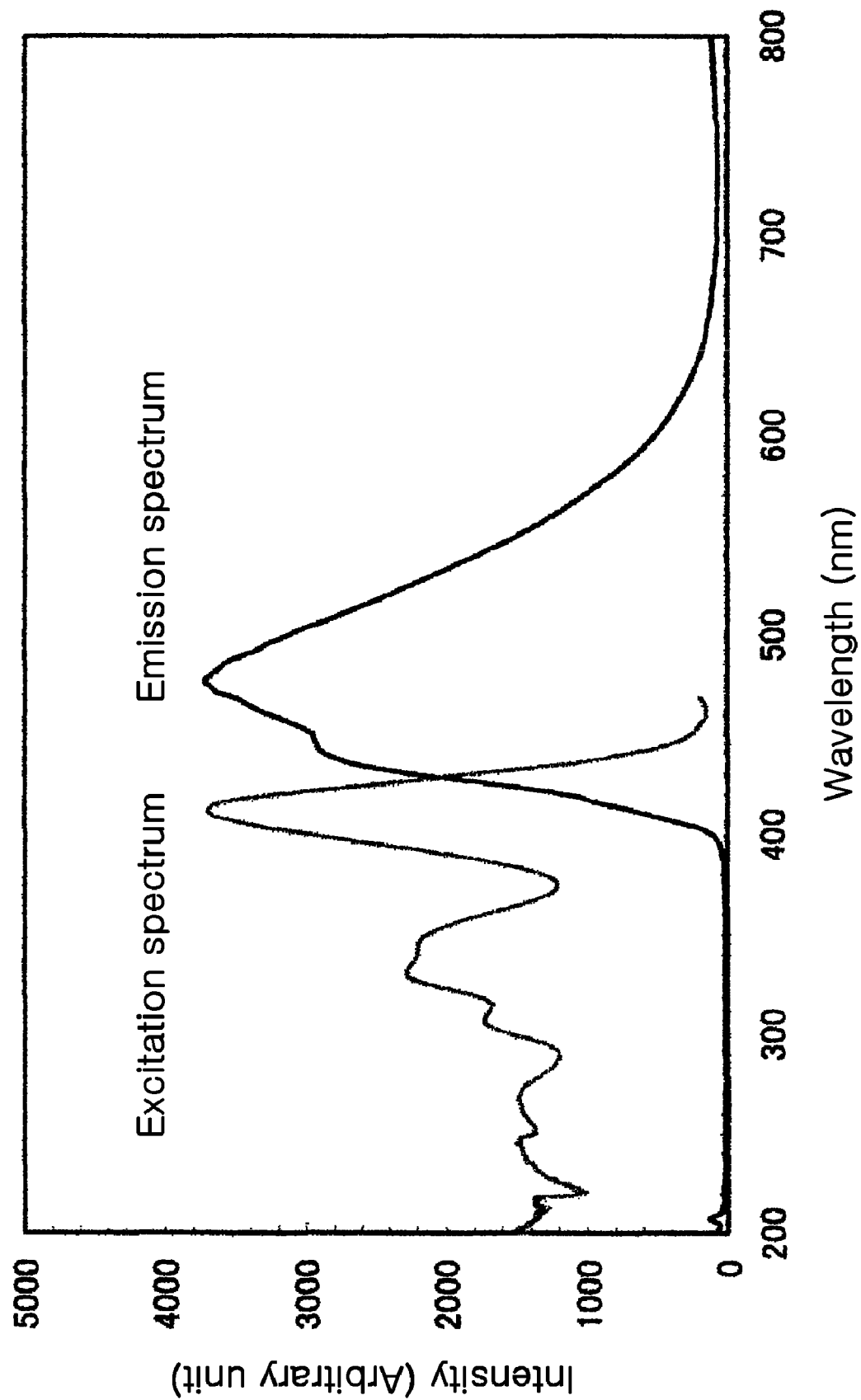
FIG. 1 shows an excitation spectrum and an emission spectrum measured in fluorescence measurement according to Example 1.

DESCRIPTION OF NOTATIONS 1 mixture of blue phosphor (Example 1) of the present invention, red phosphor, and green phosphor; mixture of blue phosphor (Example 1) of the present invention and red phosphor; mixture of blue phosphor (Example 1) of the present invention and yellow phosphor.
2 LED chip
3, 4 conductive terminal
5 wire bonding
6 resin layer
7 container
8 red phosphor
9 blue phosphor
10 green phosphor
11, 12, 13 ultraviolet ray emission cell
14, 15, 16, 17 electrode
18, 19 dielectric layer
20 protective layer
21, 22 glass substrate

BEST MODE TO CARRY OUT THE INVENTION

In the following, the examples of the present invention are described in detail.

The fluorescent substance (or phosphor) of the present invention includes a nitride or oxynitride solid solution in a crystalline phase having the $\beta$-$Si_3N_4$ crystal structure, AlN crystal structure, or AlN polytype structure (hereinafter, the solid solution to be called $\beta$-$Si_3N_4$ type crystal) as a main component. The $\beta$-$Si_3N_4$ type crystal can be identified by the X-ray diffraction or neutron diffraction. Not only a substance showing the same diffraction pattern as the pure $\beta$-$Si_3N_4$, but also a substance having changed lattice parameters, as other elements substitute original constituent elements, is $\beta$-$Si_3N_4$ type crystal.

Here, the pure $\beta$-$Si_3N_4$ crystal structure belongs to the hexagonal system having $P6_3$ or $P6_3/m$ symmetry, and is a crystal defined as a structure having ideal atom positions of Table 1 (refer to Non-patent reference 1). The position of each atom deviates from the ideal position by about ±0.05 depending on the kind of the atom. The lattice constants thereof are a=0.7595 nm and c=0.29023 nm. When its constituent Si is replaced by an element such as Al, N is replaced by an element such as O, or a metal atom such as Ce is introduced to form a solid solution, the lattice constants change. However, the basic crystal structure, sites occupied by the atoms, and atom positions designated by the coordinates do not change greatly. Therefore, once the lattice constants and the plane indices of the pure $\beta$-$Si_3N_4$ are given, the positions of X-ray diffraction peaks (2θ) are almost uniquely determined. When the lattice constants calculated using X-ray diffraction results obtained for a new substance substantially coincide with the data from diffraction peak positions (2θ) calculated using the plane indices of the pure substance, the crystal structure of the new substance is determined to be identical to that of the pure substance.

Nitride or oxynitride crystal having the $\beta$-$Si_3N_4$ crystal structure is neither specified nor limited as long as the crystal possesses the same basic crystal structure. By way of example, $\gamma$-$Si_3N_4$, $\beta$-$Ge_3N_4$, $\beta$-$C_3N_4$, and solid solutions thereof may be included as the nitride or oxynitride crystal. In the solid solution, elements C, Si, Ge, Sn, B, Al, Ga or In may substitute for each other at the Si site of the $\beta$-$Si_3N_4$ crystal structure, or elements O or N may substitute for each other at the N site of the $\beta$-$Si_3N_4$ crystal structure. Further, such substitution among these elements may occur for one kind of element as well as two or more kinds of elements at the same time. Among the above crystals, $\beta$-$Si_3N_4$ and $\beta$-sialon ($Si_{6-z}Al_zO_zN_{8-z}$, here, 0<z<4.2) crystals show particularly high brightness.

Here, the pure AlN crystal structure is a wurtzite-type crystal structure. Further, the AlN polytype crystal is a crystal in which silicon and/or oxygen are added to AlN, and includes 2H$\delta$:$Si_{2.40}Al_{8.60}O_{0.60}Ni_{11.40}$,
27R:$Al_9O_3N_7$:1$Al_2O_3$-7AlN,
21R:$Al_7O_3N_5$: 1$Al_2O_3$-5AlN,
12H: $SiAl_5O_2N_5$: 1$SiO_2$-5AlN,
15R: $SiAl_4O_2N_4$: 1$SiO_2$-4AlN,
8H: $Si_{0.5}Al_{3.5}O_{2.5}N_{2.5}$:0.5$SiO_2$-0.5$Al_2O_3$-2.5AlN, and the like. In the present invention, the above crystals can be used as host crystals. The AlN crystal or AlN polytype crystal can be identified by means of the X-ray diffraction or neutron diffraction analysis. In addition to substances which show the identical or substantially identical X-ray diffraction patterns as the pure AlN crystal or the AlN polytype crystal, a crystal having lattice parameters changed by substituting another element for a constituent element is also included in the AlN polytype crystal.

As far as luminescence emission is concerned, it is desirable that the crystalline phase of the constituents of the present invention, that is, the crystalline phase of nitride or oxynitride of the $\beta$-$Si_3N_4$ crystal structure, AlN crystal structure, or AlN polytype structure, is highly pure and contains as much of the above-mentioned crystal structure as possible, and more desirably consists of a single phase if possible. However, the crystalline phase may be formed of a mixture with other crystalline phases and amorphous phases as far as substance performance is not deteriorated. In such a case, the content of the crystalline phase of nitride or oxynitride of the $\beta$-$Si_3N_4$ crystal structure, AlN crystal structure, or AlN polytype structure is preferably equal to or larger than 50 mass % to obtain a high brightness. In the present invention, the content of the crystalline phase of nitride or oxynitride having the $\beta$-$Si_3N_4$ crystal structure as the main component is preferably at least 50 mass %.

By adopting the crystal of nitride or oxynitride of the $\beta$-$Si_3N_4$ crystal structure, AlN crystal structure, or AlN polytype structure as the host crystal and introducing a metal element M (wherein M stands for Ce) as a solid solute, the metal element functions as a luminescence center to exhibit luminescence characteristics. The $\beta$-sialon crystal containing Ce, that is a crystal containing both Al and Ce, particularly excels in blue emission characteristics.

A fluorescence having a peak in a wavelength region from 450 nm to 500 nm is emitted by the phosphor of the present invention upon irradiation of an excitation source. An emission spectrum having a peak in the above region represents blue light. A phosphor having a peak in a wavelength region from 470 nm to 490 nm has particularly high brightness. The colors of the above emission spectra have (x, y) values on the CIE chromaticity coordinates of 0≦x≦0.3 and 0≦y≦0.4, which correspond to a blue emission of high calorimetric purity.

The fluorescent light with a high brightness may be emitted from the phosphor upon irradiation of light having the wavelength that is at least 100 nm and does not exceed 500 nm (a vacuum ultraviolet ray, a deep ultraviolet ray, an ultraviolet ray, a near ultraviolet ray, a visible light from violet to blue regions) and an electron beam, an X-ray, and the like as an excitation source.

In the present invention, it is not necessary to limit or specify the kind of composition as long as it is a nitride or oxynitride crystal having the $\beta$-Si$_3$N$_4$ crystal structure. However, it is more likely to obtain a phosphor which can emit a fluorescent light with a high brightness since the content ratio of nitride or oxynitride crystal having the $\beta$-Si$_3$N$_4$ crystal structure tends to be higher with the following composition.

The composition of the following range is preferable to obtain a phosphor having the high content ratio of nitride or oxynitride crystal of the $\beta$-Si$_3$N$_4$ crystal structure and exhibiting a high brightness. The composition includes M (M stands for Ce), A (A stands for one or two elements selected from Si and Al), and X (X stands for one or two elements selected from O and N), and is expressed by a composition formula M$_a$A$_b$X$_c$ (a+b+c=1 in the formula), wherein the values of 'a', 'b', and 'c' are selected so that all the following conditions are satisfied:

$$0.00001 \leq a \leq 0.01 \quad (1),$$

$$0.38 \leq b \leq 0.52 \quad (2),$$

and $$0.45 \leq c \leq 0.61 \quad (3).$$

Here, the symbol 'a' represents an addition amount of the element 'M' which constitutes the luminescence center. The addition amount may be adjusted to be at least 0.00001 and not to exceed 0.01 in terms of the atomic ratio. When the value 'a' is smaller than 0.00001, the number of 'M' to serve as the luminescence center becomes too small, and the emission intensity may be reduced. When the value 'a' is larger than 0.01, the emission intensity may also be reduced due to the concentration quenching caused by interactions between ions 'M'. The symbol 'b' represents the amount of a metal element which forms the host crystal, and may be adjusted to be at least 0.38 and not to exceed 0.52 in terms of atomic ratio. Preferably, the value 'b' may be equal to or substantially equal to 0.429. When the value 'b' deviates from the above range, bonds in the crystal tend to be unstable, the proportion of generation of crystalline phases other than the $\beta$-Si$_3$N$_4$ structure is increased, and the emission intensity of the blue emission may be reduced. The value 'c' represents the amount of a non-metal element and may be adjusted to be at least 0.45 and not to exceed 0.61 in terms of atomic ratio. Preferably, the value 'c' may be equal to or substantially equal to 0.571. When the value 'c' deviates from the above range, bonds in the crystal tend to be unstable, the proportion of formation of crystalline phases other than the $\beta$-Si$_3$N$_4$ structure may be increased, and the emission intensity of the blue emission may be reduced.

When the $\beta$-sialon is adopted as a host crystal, a composition represented by Ce$_d$Si$_e$Al$_f$O$_g$N$_h$ (d+e+f+g+h=1 in the formula) yields a phosphor with a fluorescent light of a high brightness, wherein the values are selected so that all the following conditions are satisfied:

$$0.00001 \leq d \leq 0.01 \quad (1),$$

$$0.07 \leq e \leq 0.42 \quad (2),$$

$$0.005 \leq f \leq 0.41 \quad (3),$$

$$0.0005 \leq g \leq 0.1 \quad (4),$$

and $$0 \leq h \leq 1 \quad (5).$$

The symbol 'd' represents an addition amount of Ce which serves as a luminescence center and may be preferably adjusted to be at least 0.00001 and not to exceed 0.01 in terms of the atomic ratio. When the value 'a' is smaller than 0.00001, the number of ions 'M' to serve as a luminescence center is small and the emission intensity may be reduced. When larger than 0.01, the brightness may be reduced due to the concentration quenching caused by interactions between ions 'M'. The symbol 'e' represents the amount of Si, and may be preferably adjusted to be at least 0.07 and not to exceed 0.42 in terms of the atomic ratio. The symbol 'f' represents the amount of Al, and may be preferably adjusted to be at least 0.005 and not to exceed 0.41 in terms of the atomic ratio. The sum of the values 'e' and 'f' may be preferably adjusted to be at least 0.41 and not to exceed 0.44, and may more preferably be substantially equal to 0.429. When the values 'e' and 'f' deviate from the above ranges, proportion of formation of crystalline phases other than $\beta$-sialon may be easily increased and the emission intensity of the blue emission may be reduced. The symbol 'g' represents the amount of oxygen, and may be preferably adjusted to be at least 0.0005 and not to exceed 0.1 in terms of the atomic ratio. The symbol 'h' represents the amount of nitrogen, and the sum of the values 'e' and 'h' may be preferably adjusted to be at least 0.56 and not to exceed 0.59. Preferably, the value 'c' is equal to 0.571 (c=0.571), or 'c' is substantially equal to 0.571. When the values 'e' and 'h' deviate from the above ranges, proportion of formation of crystalline phases other than $\beta$-sialon may be increased and the emission intensity of the blue emission may be reduced.

Other elements as impurities may be included in the composition as long as such impurities do not degrade the properties. The impurities which degrade the emission characteristics may include such elements as Fe, Co, Ni, and the like and the emission intensity of the emission may be reduced when the total amount of the above three elements exceeds 500 ppm.

In the present invention, it is preferable that the crystalline phase consists of the crystalline phase of nitride or oxynitride of the $\beta$-Si$_3$N$_4$ crystal structure, AlN crystal structure, or AlN polytype structure. However, the crystalline phase may also consist of a mixture with other crystalline phases or amorphous phases in a range in which phosphor properties are not degraded. In such a case, it is more preferable that the concentration of the crystalline phase of nitride or oxynitride of the $\beta$-Si$_3$N$_4$ crystal structure, AlN crystal structure, or AlN polytype structure as the host crystal is at least 50 mass %. Because the high brightness may be maintained with such composition. That is, it is preferable that the main component contains at least 50 mass % of the crystalline phase of nitride or oxynitride of the $\beta$-Si$_3$N$_4$ crystal structure, AlN crystal structure, or AlN polytype structure. The proportion of the contained amount can be obtained by the X-ray diffraction measurement technique with the ratio of the intensity of the strongest peak of the crystalline phase of nitride or oxynitride of the $\beta$-Si$_3$N$_4$ crystal structure, AlN crystal structure, or AlN polytype structure to that of the strongest peak of other crystalline phases.

The phosphor composed of a mixture with other crystalline phases or amorphous phases may further be mixed with an electrically conductive inorganic material. When the phosphor of the present invention is excited by an electron beam in VFD and PDP devices, it is preferable that the phosphor has some electrical conductivity to discharge electrons outside for preventing accumulation of the electrons on the phosphor. Therefore, it is preferable to mix the phosphors with an inorganic substance having electrical conductivity. As an electrically conductive substance, the oxide, oxynitride or nitride of one or more elements selected from the group consisting of Zn, Ga, In, Sn, and a mixture thereof may be cited. Among them, indium oxide and indium-tin oxide (ITO) are most preferable, because these compounds exhibit high electrical conductivity without much reducing the fluorescence intensity.

The morphology of the phosphor of the present invention is not particularly limited, and the phosphor may be used in a powder state. In this case, the phosphor comprises: preferably single crystals having an averaged particle diameter that is at least 50 nm and does not exceed 20 μm to obtain the high brightness. When the averaged particle diameter of the phosphor is larger than 20 μm, dispersion in filler or dispersant may become insufficient in the event that the phosphor is applied to lighting devices or image display devices. That is, color inhomogeneity may easily arise. For this reason, an averaged particle diameter not exceeding 20 μm is preferable. On the other hand, when the averaged particle diameter becomes smaller than 50 nm, a powdery phosphor easily aggregates, thereby making phosphor handling more difficult.

The method of manufacturing the phosphor according to the present invention is not particularly limited hereto, but, by way of example, the following method may be utilized.

A raw material mixture which is a mixture of metal compounds and capable of forming a $M_aSi_bAl_cO_dN_e$ composition (wherein 'M' represents Ce) by firing is fired in a nitrogen atmosphere. The optimum firing temperature depends on the composition and cannot be specified for all cases, but, generally, a temperature range that is at least 1820 degree Celsius and does not exceed 2200 degree Celsius is preferable. It is more preferable that the temperature range that is at least 1900 degree Celsius and does not exceed 2000 degree Celsius. When the firing process is performed in such a temperature range, a blue phosphor is stably obtained. When the firing temperature is lower than 1820 degree Celsius, the element 'M' to form a luminescence center does not form an enough amount of solid solution with the nitride or oxynitride of the β-$Si_3N_4$ crystal structure, AlN crystal structure, or AlN polytype structure, and may often remain in grain boundaries which contain a large amount of oxygen. Therefore, the emission of the element 'M' having oxide glass as a host is obtained. The emission tends to have a shorter wavelength, and desirable blue fluorescent luminescence is hardly obtained. In Patent reference 5, the firing temperature is 1550 degree Celsius, and the element 'M' seems to rather stay in grain boundaries than be introduced into a crystal as a solid solute. That is, in Patent reference 5, even when Ce is employed as an activator element, the emission wavelength resides in a rather violet region of 440 to 460 nm, which is interpreted as essentially different from the blue emission of 470 to 500 nm, which is the emission wavelength of the phosphor of the present invention. Further, the excitation wavelength of the Ce-activated phosphor of Patent reference 5 is found in a wavelength region of 300 to 315 nm, which is different from violet light of the 380 to 430 nm region necessary for white emitting LED application. In the meanwhile, to achieve a firing temperature of 2200° C. or higher, special facilities are generally required which are not necessarily suitable for industrial production. Here, a manufacturing method as a mere example is mentioned, and another manufacturing method may be employed and other conditions may be applied in which Ce is capable of forming a solid solution.

The mixture of metal compounds to serve as the raw material may be a mixture of: a metal compound including 'M' selected from metal, oxide, carbonate, nitride or oxynitride of 'M'; silicon nitride; and aluminum nitride. These compounds have such advantages, in addition to their reactive properties and readiness of obtaining a synthesized compound with a high purity, that they are easily available since they are produced as industrial raw materials.

In order to improve reactivity in the firing process, an inorganic compound which forms a liquid phase at a temperature below the firing temperature may be added to the metal compound mixture if necessary. For the present purpose, an inorganic compound which forms a stable liquid phase at a reaction temperature is preferable, and the fluoride, chloride, iodide, bromide, or phosphate of an element such as Li, Na, K, Mg, Ca, Sr, or Ba is suitable for this purpose. Each of these inorganic compounds may be added separately, or two or more of them may be mixed. Among the inorganic compounds, calcium fluoride is suitable because of the high capability thereof of enhancing the reactivity. The addition amount of the inorganic compound is not specifically limited, but a particularly big effect is obtained when the amount is 0.1 to 10 parts by weight to 100 parts by weight of the metal compounds being a starting raw material. When the addition amount is smaller than 0.1 part by weight, only insufficient improvement of the reactivity is attained, while the amount of addition is larger than 10 parts by weight, the brightness of the phosphor may possibly fall. By firing the phosphor after adding these inorganic compounds, reactivity is improved and particle growth is promoted in a relatively short time to yield single crystals of a large particle diameter, thereby improving the brightness of the phosphor. Further, by washing with a solvent for dissolving these inorganic compounds after firing, the concentration of the inorganic compounds contained in the reaction product obtained by firing can be reduced. By reducing the content in the above way, the brightness of the phosphor is improved. Water, ethanol, sulfuric acid, hydrofluoric acid, and a mixture of sulfuric acid and hydrofluoric acid may be utilized as such solvents.

As the nitrogen atmosphere, a gaseous atmosphere in a pressure range that is at least 0.1 MPa and that does not exceed 100 MPa is preferable. It is more preferable that the pressure range that is at least 0.5 MPa and that does not exceed 10 MPa. When silicon nitride is used as a raw material and the firing process is performed at a temperature of 1820 degree Celsius or higher, the silicon nitride contained in the raw material decomposes easily in a nitrogen atmosphere of 0.1 MPa or lower. Hence, a pressure of higher than 0.1 MPa is more preferable. When the same thermal condition is adopted and the nitrogen atmosphere has a pressure of higher than 0.5 MPa, the silicon nitride as the raw material decomposes scarcely. When the nitrogen atmosphere has a pressure of higher than 10 MPa, silicon nitride decomposition is further suppressed. However, such a high pressure applies a greater load to facilities. A pressure of 100 MPa or higher requires specific facilities, which are inappropriate for the industrial production.

By using a method in which metal compound as powder or aggregate is charged in a container while maintaining a filling rate of a bulk density that does not exceed 40% and then fired, particularly high brightness may be obtained. When fine powder of a particle diameter of several micrometers is employed as a starting material, a mixture after completion of a mixing process exhibits morphology in which the fine powder of a particle diameter of several micrometers aggregates to a size of several hundreds of micrometers to several millimeters (hereinafter called powder aggregate). In the present invention, the powder aggregate is fired in a state of maintaining a filling rate of a bulk density that does not exceed to 40%. That is, in usual sialon production, the firing process is performed after molding by a hot-press method or die molding, and hence the firing process is applied to a state in which a powder filling rate is high. In the present invention, however, the powder aggregate of a mixture in which the particle size is made uniform is charged into a container or the like with a filling rate of a bulk density that does not exceed 40% without applying any mechanical force or without molding with a die in advance. If necessary, the powder aggregate may be subjected to particle size control by granulating to an averaged particle diameter that does not exceed 500 μm by using a sieve or an air classifier. Otherwise, the powder aggregate may be granulated directly into a shape of 500 μm or smaller by using a spray dryer. A container of boron nitride has an advantage of little reactivity with the phosphor.

The reason why the firing process is performed while holding the bulk density that does not exceed 40% is that, when the raw material powder is fired while leaving a free space around the raw material powder, reaction products grow as crystals into a free space, the crystals have less chance to come into contact with each other, and crystals with a smaller number of surface defects are synthesized. Therefore, a phosphor with a high brightness is obtained. When the bulk density exceeds 40%, partial densification takes place during the firing, and a dense sintered body appears, which hinders crystal growth. As a result, the brightness of the phosphor is reduced, and fine powder is hardly obtained. The size of the powder aggregate of 500 μm or smaller is particularly preferable to achieve excellent grinding properties after the firing. The lower limit of the bulk density is not particularly specified, but may be considered as follows from an industrial point of view; the range of the bulk density depends on the size or shape of raw material powder particles, and it is reasonable to take a value of around 10% as the lower limit when the general raw material powder commercially available is employed.

Then, the powder aggregate having a filling rate of 40% or smaller is fired under the above condition. A furnace used for firing is preferably heated by metal resistance heating or graphite resistance heating, and carbon is preferably used as the high temperature part of the furnace because the firing temperature is high and nitrogen is employed as the firing atmosphere. For firing, a sintering method in which no mechanical pressure is applied from the outside, such as normal pressure sintering and gas pressure sintering, is desirable to perform firing while keeping high bulk density.

When the powder aggregate obtained by firing is solidified hard, the aggregate is ground by using a mill usually employed in the factory, such as a ball mill, jet mill, and the like. Among them, the particle size is controlled most easily in ball milling. A silicon nitride sintered body or a sialon sintered body is preferable as the materials of balls and pots for the present purpose. A ceramic sintered body having the same composition as a phosphor product is particularly preferable. Grinding is continued until an averaged particle diameter of 20 μm or smaller is reached. Particularly desirable averaged particle diameter is at least 20 nm and does not exceed 5 μm. When the averaged particle diameter exceeds 20 μm, the fluidity of the powder and dispersion into resin deteriorate, and emission intensity may become nonuniform from part to part when a light emitting device is built by combining the phosphor with a light-emitting device. When the averaged particle diameter reaches a level of 20 nm or smaller, it becomes more difficult to handle the phosphor powder. If an objective particle diameter is not obtained by grinding alone, classification may be used in combination with the grinding. Sieving, air classification, and settling in a liquid may be employed as means of classification.

Acid treatment may be used as one of methods of pulverization and classification. In the powder aggregate obtained by firing, a single crystal of nitride or oxynitride of the β-$Si_3N_4$ crystal structure is in most cases fixed hard at a grain boundary phase which is mainly composed of a small quantity of glass phase. When the powder aggregate is immersed in such a case in an acid having a specific composition, the grain boundary phase mainly consisting of the glass phase is selectively dissolved and single crystals are separated. In this way, every particle is obtained not as an aggregate of single crystals but as a particle consisting of one single crystal of the nitride or oxynitride of the β-$Si_3N_4$ crystal structure. Such a particle is composed of a single crystal which has only a small number of surface defects, thereby resulting in a phosphor with a high brightness.

As an acid which are effective for this treatment, hydrofluoric acid, sulfuric acid, hydrochloric acid, and a mixture of hydrofluoric acid and sulfuric acid may be utilized. Among them, the mixture of hydrofluoric acid and sulfuric acid demonstrates a high effect of removing the glass phase.

Although fine phosphor powder is obtained through the above processes, the heat treatment is effective in order to further improve the brightness. For this purpose, the powder after firing or the powder after particle size adjustment by pulverization and classification can be subject to heat treatment at a temperature that is at least 1000 degree Celsius and less than the firing temperature. At a temperature lower than 1000° C., the effect of removing surface defects is relatively low. A temperature higher than or equal to the firing temperature is unpreferable because particles of the ground phosphor aggregate again with each other. An atmosphere suitable for heat treatment depends on phosphor compositions. As for an atmosphere suitable for the heat treatment, the (mixture) atmosphere having one or more gases selected from the group consisting of nitrogen, air, ammonia and hydrogen can be used. Among them, a nitrogen atmosphere is particularly preferable since this atmosphere exhibits a pronounced effect of removing defects.

The thus-obtained nitride of the present invention has an excitation region extending from the ultraviolet to visible light, which is broader than the excitation region of an usual oxide phosphor and sialon phosphor of the prior art, and shows a blue emission having a peak in a wavelength region that is at least 450 nm and does not exceed 500 nm. Moreover, the nitride has a broad emission spectrum, and hence is suitable for lighting devices and image display devices. Further, the nitride does not deteriorate even when exposed to high temperatures and then has superior thermal resistance, and excels in a long-term stability in an oxidizing atmosphere and moist environment.

The lighting device of the present invention is configured with at least a light-emitting source and the phosphor of the present invention. The lighting device may include a LED lighting device and a fluorescent lamp. The LED lighting device can be manufactured using the phosphor of the present invention and a publicly known method which is described in Japanese Patent Application Publication No. H05-152609, Japanese Patent Application Publication No. H07-99345, Japanese Patent No. 2927279, and the like. In this case, a light-emitting source which emits light with a wavelength of 350 to 500 nm is preferred, of which a 380 to 430 nm violet (or ultraviolet)-emitting LED is especially preferred.

Such a light-emitting device includes those devices comprised of a nitride semiconductor such as GaN, InGaN, and the like, which can constitute a light-emitting source emitting light of a predetermined wavelength by adjusting compositions thereof.

A lighting device which emits a desired color can be constructed using a phosphor having other light-emitting properties together rather than using the phosphor of the present invention alone. An example thereof may be a combination of: an LED or LD light-emitting device which emits 380 to 430 nm ultraviolet or violet light; and a phosphor which is excited by this wavelength, such as a green phosphor which has an emission peak at a wavelength region that is at least 500 nm and that does not exceed 600 nm, a red phosphor which has an emission peak at a wavelength region that is at least 600 and that does not exceed 700 nm and a blue phosphor of the present invention. As such a green phosphor, $BaMgAl_{10}O_{17}$: (Eu, Mn) and $\beta$-SiAlON:Eu which is described in Japanese Patent Application No. 2004-070894 can be cited, and as a red phosphor, $CaSiAlN_3$:Eu which is described in Patent application No. 2003-394855 can be utilized. When ultraviolet or violet light emitted by an LED or LD irradiates the phosphors, light beams of three colors, namely red, green and blue, are emitted, and a white lighting device is obtained by admixing these color beams.

As another means, there is a combination of: an LED or LD which emits 380 to 430 nm ultraviolet or violet light; a yellow or an orange phosphor which is excited by this wavelength and has a light-emission peak in a wavelength region of 550 nm or longer and 600 nm or shorter; and the phosphor of the present invention. As such a yellow or orange phosphor, $(Y, Gd)_2(Al, Ga)_5O_{12}$: Ce which is described in Japanese Patent Application Publication No. H09-218149 and $\alpha$-sialon: Eu which is described in Japanese Patent Application Publication No. 2002-363554 can be used. Among them, Ca-$\alpha$-sialon into which Eu is dissolved as a solid solute is more preferable, since the emission intensity thereof is high. In this configuration, when ultraviolet or violet light which LED or LD emits irradiates the phosphor, a yellow or orange light beam and a blue light beam are emitted, and these two colors are mixed to yield a nearly white color. A broad range of colors extending from bluish white and white colors to a reddish electric bulb color are obtained by changing the blend ratio of the two types of phosphors.

The image display device of the present invention comprises: at least an excitation source and the phosphor of the present invention, and includes a vacuum fluorescent display (VFD), a field emission display (FED), a plasma display panel (PDP), a cathode-ray tube (CRT), and the like. It has been confirmed that the phosphor of the present invention emits light by excitation of 100 to 190 nm vacuum ultraviolet light, 190 to 380 nm ultraviolet light, an electron beam, or the like, and the above image display devices are constructed by combining these excitation sources and the phosphor of the present invention.

The present invention is described in more detail with examples to be shown below. However, these examples are disclosed only to help the understanding of the present invention with ease. Therefore, the present invention is not limited to these examples.

Example 1

Silicon nitride powder of 92%-$\alpha$-type (E10 grade manufactured by Ube Industries, Ltd.) having an averaged particle diameter of 0.5 µm and containing 0.93 wt % of oxygen; and aluminum nitride powder having a specific surface area of 3.3 m$^2$/g and containing 0.79% oxygen; and cerium-oxide powder of 99.9% purity were used for a raw material powder. In the raw material powder, for example, F-grade aluminum nitride produced by Tokuyama Corporation and cerium-oxide powder produced by Shin-Etsu Chemical Co., Ltd. were used.

In order to obtain a compound shown by a composition formula: $Ce_{0.000951}Si_{0.40894}Al_{0.021715}O_{0.0014265}N_{0.566968}$ (Table 2 shows design compositions, and Table 3 shows the mixture compositions of raw material powders), silicon nitride powder, aluminum nitride powder and cerium-oxide (CeO$_2$) powder were weighed so that the powder materials occupy 94.812 wt %, 4.414 wt %, and 0.774 wt %, respectively, and then mixed for 2 hours with a wet ball mill using a pot made of a silicon nitride sintered body, balls made of a silicon nitride sintered body and n-hexane. Then the n-hexane was removed using a rotary evaporator to obtain a dried material of the mixed powder. After grinding the obtained mixture using an agate mortar and pestle, the resultant mixture was passed through a 500 µm sieve, thereby obtaining a powder aggregate having excellent fluidity. When this powder aggregate was allowed to fall freely into a boron nitride crucible having a diameter of 20 mm and a height of 20 mm, a bulk density of 25 vol % was obtained. The bulk density was calculated from the weight of the charged powder aggregate and the inner volume of the crucible. Next, the crucible was set into an electric furnace of a graphite resistance heating type. In the firing operation, a firing atmosphere was made vacuum with a diffusion pump, and the furnace temperature was raised at a rate of 500° C./h from a room temperature to 800 degree Celsius. Nitrogen of 99.999 vol % purity was introduced into the furnace at 800 degree Celsius to make the pressure 1 MPa, and temperature was raised to 2000 degree Celsius at 500° C./h, and held at 2000 degree Celsius for 8 hours.

First, the synthesized specimen was ground to powder using an agate mortar, and the powder X-ray diffraction measurement (XRD) using the Cu K$\alpha$ ray was performed. Since the obtained chart indicates the $\beta$-silicon nitride structure and composition analysis shows that Al and O were present, it turned out that $\beta$-sialon was formed. After coarse grinding of the firing product, further grinding was applied by using a silicon nitride mortar and pestle. Particle size distribution showed that the averaged particle diameter was 8 µm.

By irradiating this powder with a lamp which emits light having a wavelength of 405 nm, it was confirmed that the blue light was emitted from the powder. A result of measuring the emission spectrum and excitation spectrum (FIG. 1) of this powder using a fluorescent spectrophotometer shows that the powder constitutes a phosphor which shows a peak of the excitation spectrum at 411 nm and exhibits a peak of the emission spectrum at 477 nm blue region by 411 nm excitation. The peak emission intensity was 3717 counts. Since the counted value changes with a measuring instrument and conditions, the count unit is an arbitrary unit. That is, comparisons can be made only between the present examples and comparative examples measured in the same conditions. The CIE chromaticity of light emitted by 411 nm excitation was in a blue region of x=0.24 and y=0.26.

Examples 2 to 24

In order to obtain compositions shown in Table 2 by using the same raw material powder as that of example 1, prescribed amounts of silicon nitride powder, aluminum nitride powder and europium oxide powder were weighed, and mixed for 2 hours with a wet ball mill using a pot made of a silicon nitride sintered body, balls made of a silicon nitride sintered body, and n-hexane. Then the n-hexane was removed using a rotary evaporator to obtain a dried material of the mixed powder. After grinding the obtained mixture by using an agate mortar and pestle, the resultant mixture was passed through a 500 µm sieve, thereby obtaining a powder aggregate having excellent fluidity. This powder aggregate was allowed to fall freely into a boron nitride crucible having a diameter of 20 mm and a height of 20 mm. Next, the crucible was set into an electric furnace of a graphite resistance heating type. In a firing operation, a firing atmosphere was made vacuum with a diffusion pump, and the furnace temperature was raised at a rate of 500° C./h from the room temperature to 800 degree Celsius. Nitrogen of 99.999 vol % purity was introduced into the furnace at 800 degree Celsius to make the pressure 1 MPa, and temperature was raised to 2000 degree Celsius at 500° C./h, and held at 2000 degree Celsius for 8 hours. The fired products thus obtained all contain at least 50 mass % of the β-$Si_3N_4$ crystal structure, AlN crystal structure, or AlN polytype structure. Fluorescent spectra measurements show that, as shown in Table 4, blue-emitting phosphors were obtained which exhibit a peak at a wavelength region of 470 nm to 480 nm under excitation by rays from the ultraviolet to visible region. Table 4 summarizes the optical properties of the above examples and comparative examples.

TABLE 2

Parameters in designed compositions

| | Parameters | | | | | | | |
|---|---|---|---|---|---|---|---|---|
| | a | b | c | d | e | f | g | h |
| | Elements | | | | | | | |
| | M | A | X | Ce | Si | Al | O | N |
| Example 1 | 0.0010 | 0.4307 | 0.5684 | 0.0010 | 0.4089 | 0.0217 | 0.0014 | 0.5670 |
| Example 2 | 0.0010 | 0.4275 | 0.5715 | 0.0010 | 0.4089 | 0.0186 | 0.0201 | 0.5514 |
| Example 3 | 0.0010 | 0.4275 | 0.5715 | 0.0010 | 0.3886 | 0.0389 | 0.0404 | 0.5311 |
| Example 4 | 0.0011 | 0.4274 | 0.5715 | 0.0011 | 0.3664 | 0.0611 | 0.0627 | 0.5088 |
| Example 5 | 0.0011 | 0.4274 | 0.5715 | 0.0011 | 0.3419 | 0.0855 | 0.0872 | 0.4843 |
| Example 6 | 0.0009 | 0.4293 | 0.5698 | 0.0009 | 0.4176 | 0.0117 | 0.0014 | 0.5685 |
| Example 7 | 0.0009 | 0.4299 | 0.5691 | 0.0009 | 0.4134 | 0.0166 | 0.0014 | 0.5677 |
| Example 8 | 0.0010 | 0.4322 | 0.5668 | 0.0010 | 0.3994 | 0.0328 | 0.0015 | 0.5653 |
| Example 9 | 0.0011 | 0.4351 | 0.5638 | 0.0011 | 0.3812 | 0.0539 | 0.0016 | 0.5622 |
| Example 10 | 0.0012 | 0.4386 | 0.5602 | 0.0012 | 0.3594 | 0.0793 | 0.0018 | 0.5584 |
| Example 11 | 0.0013 | 0.4429 | 0.5558 | 0.0013 | 0.3327 | 0.1102 | 0.0020 | 0.5538 |
| Example 12 | 0.0015 | 0.4482 | 0.5503 | 0.0015 | 0.2993 | 0.1489 | 0.0022 | 0.5480 |
| Example 13 | 0.0017 | 0.4551 | 0.5432 | 0.0017 | 0.2565 | 0.1986 | 0.0026 | 0.5406 |
| Example 14 | 0.0020 | 0.4643 | 0.5337 | 0.0020 | 0.1994 | 0.2649 | 0.0030 | 0.5307 |
| Example 15 | 0.0024 | 0.4771 | 0.5205 | 0.0024 | 0.1196 | 0.3575 | 0.0036 | 0.5169 |
| Example 16 | 0.0026 | 0.4838 | 0.5136 | 0.0026 | 0.0780 | 0.4058 | 0.0039 | 0.5097 |
| Comparative 1 | 0.0010 | 0.4275 | 0.5715 | 0.0010 | 0.4203 | 0.0072 | 0.0087 | 0.5628 |
| Comparative 2 | 0.0009 | 0.4286 | 0.5705 | 0.0009 | 0.4217 | 0.0070 | 0.0013 | 0.5692 |
| Comparative 3 | 0.0028 | 0.4917 | 0.5055 | 0.0028 | 0.0284 | 0.4633 | 0.0043 | 0.5012 |

TABLE 3

Mixed compositions

| | Mixed compositions (wt %) | | | |
|---|---|---|---|---|
| | Si3N4 | AlN | Al2O3 | CeO2 |
| Example 1 | 94.776 | 4.412 | 0.000 | 0.811 |
| Example 2 | 94.765 | 1.259 | 3.130 | 0.846 |
| Example 3 | 89.950 | 2.629 | 6.540 | 0.883 |
| Example 4 | 84.692 | 4.124 | 10.260 | 0.924 |
| Example 5 | 78.923 | 5.765 | 14.340 | 0.969 |
| Example 6 | 96.856 | 2.369 | 0.000 | 0.775 |
| Example 7 | 95.841 | 3.367 | 0.000 | 0.793 |
| Example 8 | 92.493 | 6.655 | 0.000 | 0.851 |
| Example 9 | 88.145 | 10.928 | 0.000 | 0.927 |
| Example 10 | 82.945 | 16.037 | 0.000 | 1.018 |
| Example 11 | 76.618 | 22.254 | 0.000 | 1.128 |
| Example 12 | 68.751 | 29.984 | 0.000 | 1.265 |
| Example 13 | 58.704 | 39.855 | 0.000 | 1.441 |
| Example 14 | 45.428 | 52.900 | 0.000 | 1.672 |
| Example 15 | 27.065 | 70.942 | 0.000 | 1.993 |
| Example 16 | 17.586 | 80.255 | 0.000 | 2.158 |
| Comparative 1 | 97.463 | 0.491 | 1.220 | 0.825 |
| Comparative 2 | 97.828 | 1.415 | 0.000 | 0.758 |
| Comparative 3 | 6.393 | 91.254 | 0.000 | 2.353 |

TABLE 4

Peak wavelengths and intensities of excitation peaks and emission peaks.

| | Excitation peak wavelength (nm) | Emission peak wavelength (nm) | Emission intensity (arbitrary unit) |
|---|---|---|---|
| Example 1 | 411 | 477 | 3717 |
| Example 2 | 411 | 477 | 2779 |
| Example 3 | 412 | 478 | 3177 |
| Example 4 | 412 | 478 | 2464 |
| Example 5 | 414 | 478 | 1900 |
| Example 6 | 412 | 476 | 1223 |
| Example 7 | 412 | 477 | 2469 |
| Example 8 | 411 | 477 | 3693 |
| Example 9 | 412 | 477 | 3467 |
| Example 10 | 412 | 477 | 3265 |
| Example 11 | 411 | 477 | 3007 |
| Example 12 | 412 | 476 | 2419 |
| Example 13 | 411 | 477 | 2121 |
| Example 14 | 350 | 465 | 2050 |
| Example 15 | 353 | 461 | 2193 |
| Example 16 | 367 | 470 | 2210 |
| Comparative 1 | 411 | 476 | 339 |
| Comparative 2 | 413 | 476 | 459 |
| Comparative 3 | 352 | 476 | 705 |

Comparative Examples 1 to 3

When phosphor powder was synthesized using the same processes and conditions as used in Example 1 except that components shown in Tables 2 and 3 were taken as starting materials, no phosphors with high brightness were obtained as shown in Table 4, since composition ranges were outside the present invention.

Figure 2:
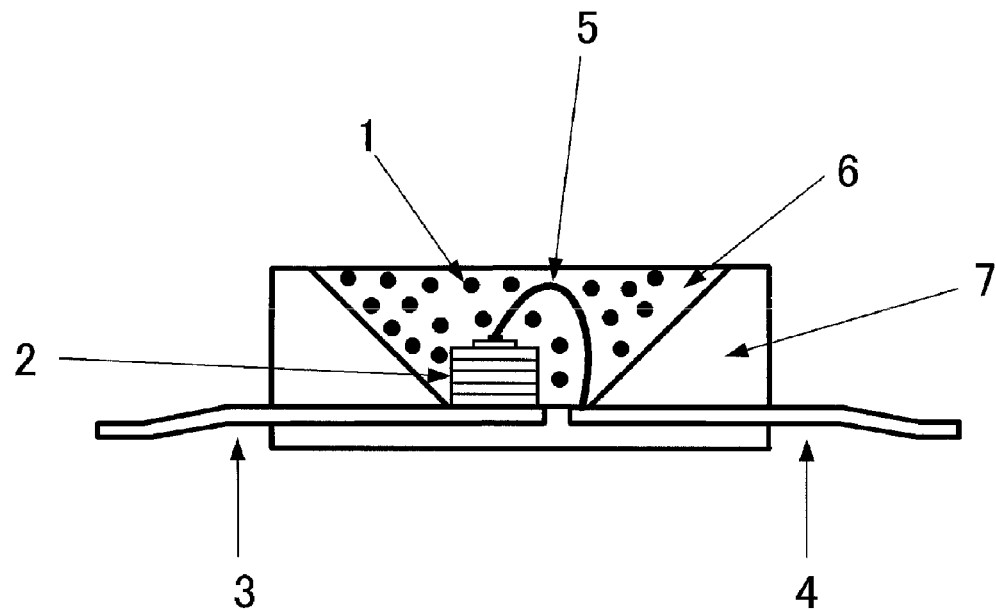
FIG. 2 is a general diagram showing a lighting device (LED lighting device) according to the present invention.

Next, a lighting device using a phosphor which comprises the nitride of the present invention is described. FIG. 2 shows a schematic diagram of a white LED as a lighting device. A 410 nm violet LED 2 is used as a light-emitting device. The phosphor of example 1 of the present invention and a Ca-α-sialon: Ce yellow phosphor with a composition of $Ca_{0.75}Eu_{0.25}Si_{8.625}Al_{3.375}O_{1.125}N_{14.875}$ are dispersed into a resin layer, which is then placed on the violet LED 2. When an electric current is supplied to conductive terminals, the LED 2 emits 410 nm light, and the yellow phosphor and blue phosphor are excited by this light, thereby emitting yellow and blue lights, respectively. Thus, the whole device functions as a lighting device, in which the light of the LED and the yellow and blue lights are admixed, so as to emit a predetermined color light. Since the lighting device has a blue component as opposed to the case where a yellow phosphor alone is used, the color rendering index of the lighting device is high.

Another lighting device which was produced employing a blending design different from the above blend is described. A 410 nm ultraviolet LED is used as a light-emitting device. The phosphor of example 1 of the present invention, a green phosphor ($BaMgAl_{10}O_{17}$: (Eu, Mn)) and a red phosphor (Ca-SiAlN$_3$:Eu) are dispersed into a resin layer, which is then placed on the ultraviolet LED. When an electric current is supplied to conductive terminals, the LED emits 410 nm light, and the red phosphor, green phosphor and blue phosphor are excited with this light, thereby emitting red, green and blue light beams, respectively. These colors of light beams are admixed to yield a lighting device emitting white light.

Figure 3:
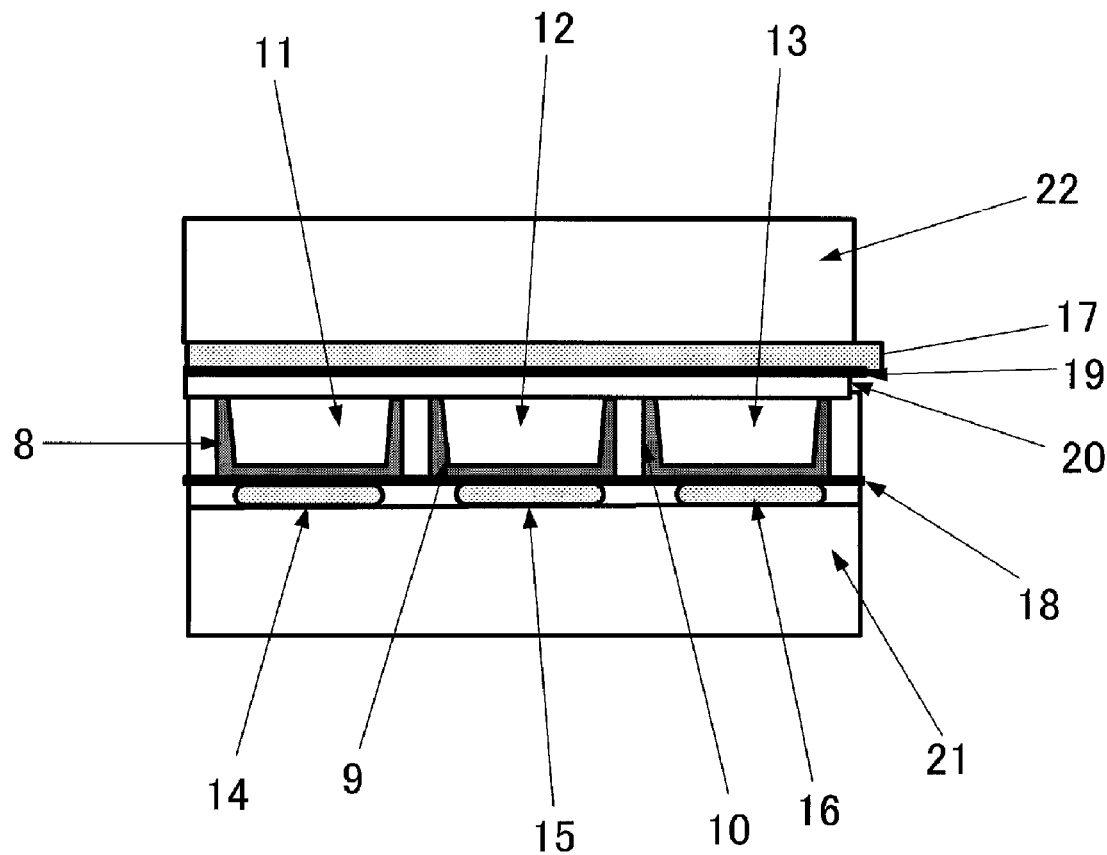
FIG. 3 is a general diagram showing an image display device (plasma display panel) according to the present invention.

Next, an example of a design of an image display device which uses a nitride phosphor of the present invention is explained. FIG. 3 is a schematic diagram showing the principle of a plasma display panel as an image display device. The blue phosphor of example 1 of the present invention, a red phosphor (Y(PV)O$_4$:Eu), and a green phosphor ($BaMgAl_{10}O_{17}$: (Eu, Mn)) are coated on the internal surface of cells 11, 12, and 13, respectively. When an electric current is supplied to electrodes 14, 15, 16, and 17, vacuum ultraviolet light is generated by Xe discharge in the cells, and the above light excites the phosphors to emit red, green, and blue visible light beams. The emitted light beams are observed from the outside via a protective layer 20, a dielectric layer 19, and a glass substrate 22 to thereby display an image.

INDUSTRIAL APPLICABILITY

The nitride phosphor of the present invention show a green emission different from the emission of conventional sialon and oxynitride phosphors, and show only small deterioration of phosphor brightness when exposed to an excitation source. Hence the nitride phosphor is used suitably for VFDs, FEDs, PDPs, CRTs, white LEDs, and the like. In the future, it is expected that the nitride phosphors are extensively utilized in the material design in various display devices and contribute to development of industry.

What is claimed is:

1. A phosphor comprising: a nitride or oxynitride crystal solid solving Ce and having β-Si$_3$N$_4$ crystal structure, AlN crystal structure, or AlN polytype structure, wherein the phosphor emits a fluorescent light having a peak in a wavelength region of 450 nm to 500 nm upon irradiation of an excitation source.

2. The phosphor according to claim 1 wherein the phosphor emits the fluorescent light having the peak in a wavelength region of 470 nm to 490 nm upon irradiation of the excitation source.

3. The phosphor according to claim 1 wherein the excitation source is an ultraviolet light or a visible light having a wavelength in a region that is at least 100 nm and does not exceed 470 nm.

4. The phosphor according to claim 1 wherein the excitation source is an violet light having a wavelength in a region from 380 nm to 430 nm.

5. The phosphor according to claim 1 wherein the nitride or oxynitride crystal having the β-Si$_3$N$_4$ crystal structure comprises β-sialon ($Si_{6-z}Al_zO_zN_{8-z}$, here, 0<z<4.2).

6. The phosphor according to claim 1 wherein the fluorescent light emitted by means of the excitation source has a half-value width of the peak equal to or more than 80 nm.

7. The phosphor according to claim 1 wherein the nitride or the oxynitride crystal has a composition expressed by a formula of $M_aA_bX_c$ (in the formula, a+b+c=1) wherein M (here, M is Ce), A (here, A is one or two elements selected from Si and Al), and X (here, X is one or two elements selected from O and N); and wherein the following conditions are satisfied:

$$0.00001 \leq a \leq 0.01 \quad (1),$$

$$0.38 \leq b \leq 0.52 \quad (2),$$

and $$0.45 \leq c \leq 0.61 \quad (3).$$

8. The phosphor according to claim 1 wherein the nitride or the oxynitride crystal has a composition expressed by a formula of $Ce_dSi_eAl_fO_gN_h$ (in the formula, d+e+f+g+h=1); and wherein the following conditions are satisfied:

$$0.00001 \leq d \leq 0.01 \quad (4),$$

$$0.07 \leq e \leq 0.42 \quad (5),$$

$$0.005 \leq f \leq 0.41 \quad (6),$$

$$0.0005 \leq g \leq 0.1 \quad (7),$$

and $$0 < h < 1 \quad (8).$$

9. The phosphor according to claim 1 wherein color of the fluorescent light emitted upon irradiation of the excitation source has (x, y) chromaticity coordinates in the CIE chromaticity coordinates satisfying conditions: $0 \leq x \leq 0.3$ and $0 \leq y \leq 0.4$.

10. The phosphor according to claim 1 wherein the nitride or oxynitride crystal comprises: single crystals having an average particle diameter that is at least 50 nm and does not exceed 20 μm.

11. The phosphor according to claim 1 wherein a sum of Fe, Co, and Ni impurity elements does not exceed 500 ppm.

12. The phosphor according to claim 1 wherein the nitride or oxynitride crystal is produced as a mixture including another crystal or amorphous compound and wherein an amount of the nitride or oxynitride crystal is at least 50 mass % in the mixture.

13. The phosphor according to claim 12 wherein the other crystal or amorphous compound is conductive inorganic compound.

14. The phosphor according to claim 13 wherein the conductive inorganic compound comprises: oxide, oxynitride, nitride, or mixture thereof including one or more kinds of elements selected from Zn, Ga, In, and Sn.

15. A method of manufacturing the phosphor comprising: a nitride or oxynitride crystal solid solving Ce and having $\beta$-$Si_3N_4$ crystal structure, AlN crystal structure, or AlN polytype structure, wherein the phosphor emits a fluorescent light having a peak in a wavelength region of 450 nm to 500 nm upon irradiation of an excitation source, the method comprising the step of: firing a raw mixture in a nitrogen atmosphere at a temperature that is at least 1820 degree Celsius and does not exceed 2200 degree Celsius.

16. A luminescent device comprising: a light-emitting source and a phosphor, wherein the phosphor comprises: a nitride or oxynitride crystal solid solving Ce and having $\beta$-$Si_3N_4$ crystal structure, AlN crystal structure, or AlN polytype structure, wherein the phosphor emits a fluorescent light having a peak in a wavelength region of 450 nm to 500 nm upon irradiation of an excitation source.

17. The luminescent device according to claim 16 wherein the light-emitting source comprises: a light-emitting diode (LED) and/or a laser diode (LD) which emits light of a wavelength from 380 nm to 430 nm.

18. The luminescent device according to claim 16,
wherein the light-emitting source is a light-emitting diode (LED) and/or a laser diode (LD) which emits light of a wavelength from 380 nm to 430 nm;
wherein the phosphor comprises: a blue phosphor having an emission peak in a wavelength region that is at least 450 nm and does not exceed 500 nm upon irradiation of an excitation light in a wavelength region of 380 to 430 nm, and a green phosphor having an emission peak in a wavelength region that is at least 500 nm and does not exceed 600 nm upon irradiation of an excitation light in a wavelength region of 380 to 430 nm, and a red phosphor having an emission peak in a wavelength region that is at least 600 nm and does not exceed 700 nm upon irradiation of an excitation light in a wavelength region of 380 to 430 nm; and
wherein the luminescent device emits a white light by mixing a blue light, a green light, and a red light.

19. An image display device comprising: an excitation source and a phosphor, wherein the phosphor comprises: a nitride or oxynitride crystal solid solving Ce and having $\beta$-$Si_3N_4$ crystal structure, AlN crystal structure, or AlN polytype structure, wherein the phosphor emits a fluorescent light having a peak in a wavelength region of 450 nm to 500 nm upon irradiation of an excitation source.

20. The image display device according to claim 19 further comprising: any one of a fluorescent display tube (VFD), a field emission display (FED), a plasma display panel (PDP), and a cathode-ray tube (CRT).

* * * * *